United States Patent
Meiser et al.

(10) Patent No.: US 11,217,658 B2
(45) Date of Patent: Jan. 4, 2022

(54) SEMICONDUCTOR DEVICE WITH ELECTRICAL RESISTOR

(71) Applicant: Infineon Technologies AG, Neubiberg (DE)

(72) Inventors: Andreas Meiser, Sauerlach (DE); Grzegorz Kozlowski, Munich (DE); Till Schloesser, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/423,535

(22) Filed: May 28, 2019

(65) Prior Publication Data

US 2019/0371882 A1 Dec. 5, 2019

(30) Foreign Application Priority Data

May 29, 2018 (DE) .......................... 102018112866.5

(51) Int. Cl.
- *H01L 49/02* (2006.01)
- *H01L 21/761* (2006.01)
- *H01L 21/762* (2006.01)

(52) U.S. Cl.
CPC ............ *H01L 28/20* (2013.01); *H01L 21/761* (2013.01); *H01L 21/76224* (2013.01)

(58) Field of Classification Search
CPC . H01L 28/20; H01L 21/761; H01L 21/76224; H01L 21/76264; H01L 27/0629; H01L 27/0802; H02M 3/00
See application file for complete search history.

(56) References Cited

U.S. PATENT DOCUMENTS

| | | | |
|---|---|---|---|
| 2005/0133864 A1* | 6/2005 | Iwamatsu | H01L 21/76283 257/347 |
| 2006/0194436 A1* | 8/2006 | Oh | H01L 27/08 438/689 |
| 2007/0046421 A1* | 3/2007 | Gogineni | H01L 27/016 338/309 |
| 2007/0069326 A1 | 3/2007 | Yoshizumi et al. | |
| 2007/0114607 A1* | 5/2007 | Pendharkar | H01L 29/66689 257/343 |
| 2013/0087828 A1 | 4/2013 | Koshimizu et al. | |
| 2013/0328619 A1 | 12/2013 | Karino et al. | |
| 2014/0021560 A1 | 1/2014 | Su et al. | |
| 2016/0148925 A1* | 5/2016 | Tonazzo | H01L 27/0259 257/361 |
| 2016/0294407 A1* | 10/2016 | Kikuta | H03M 1/08 |
| 2018/0102404 A1 | 4/2018 | Wen et al. | |

* cited by examiner

*Primary Examiner* — Marcos D. Pizarro
*Assistant Examiner* — Sue Tang
(74) *Attorney, Agent, or Firm* — Murphy, Bilak & Homiller, PLLC

(57) ABSTRACT

The disclosure relates to a semiconductor device, including a semiconductor substrate of a first conductivity type and a semiconductor layer of a second conductivity type on the semiconductor substrate, the second conductivity type being different than the first conductivity type. The semiconductor device also includes an isolation structure electrically isolating a first region of the semiconductor layer from a second region of the semiconductor layer. A shallow trench isolation structure vertically extends from a surface of the semiconductor layer into the first region of the semiconductor layer. An electrical resistor is formed on the shallow trench isolation structure.

15 Claims, 4 Drawing Sheets

SEMICONDUCTOR DEVICE WITH ELECTRICAL RESISTOR

TECHNICAL FIELD

The application relates to semiconductor devices comprising an electrical resistor.

BACKGROUND

Semiconductor devices such as power semiconductors are used for example in applications which are specified for increasingly greater power consumptions, e.g. power driver circuits for applications in automotive and industrial electronics. This is associated with requirements in respect of an improved voltage loading capacity of the components, in order for example to cope with increased voltages in the on-board electrical system of motor vehicles. This application is directed to improving the voltage loading capacity of semiconductor devices comprising an electrical resistor.

SUMMARY

The present disclosure relates to a semiconductor device, comprising a semiconductor substrate of a first conductivity type and a semiconductor layer of a second conductivity type on the semiconductor substrate, wherein the second conductivity type is different than the first conductivity type. The semiconductor device furthermore comprises an isolation structure, which electrically isolates a first region of the semiconductor layer from a second region of the semiconductor layer, and a shallow trench isolation structure, which extends vertically from a surface of the semiconductor layer into the first region of the semiconductor layer. Moreover, the semiconductor device comprises an electrical resistor on the shallow trench isolation structure.

Further features and advantages of the disclosed subject matter will become apparent to the person skilled in the art from the following detailed description and also from the drawings.

BRIEF DESCRIPTION OF THE FIGURES

The accompanying drawings serve to afford an understanding of exemplary embodiments of the invention, are included in the disclosure and form part thereof. The drawings merely illustrate exemplary embodiments and together with the description serve to elucidate same. Further exemplary embodiments and numerous advantages from among those intended will become apparent directly from the following detailed description. The elements and structures shown in the drawings are not necessarily illustrated in a manner true to scale with respect to one another. Identical reference signs refer to identical or mutually corresponding elements and structures.

DETAILED DESCRIPTION

Figure 1:
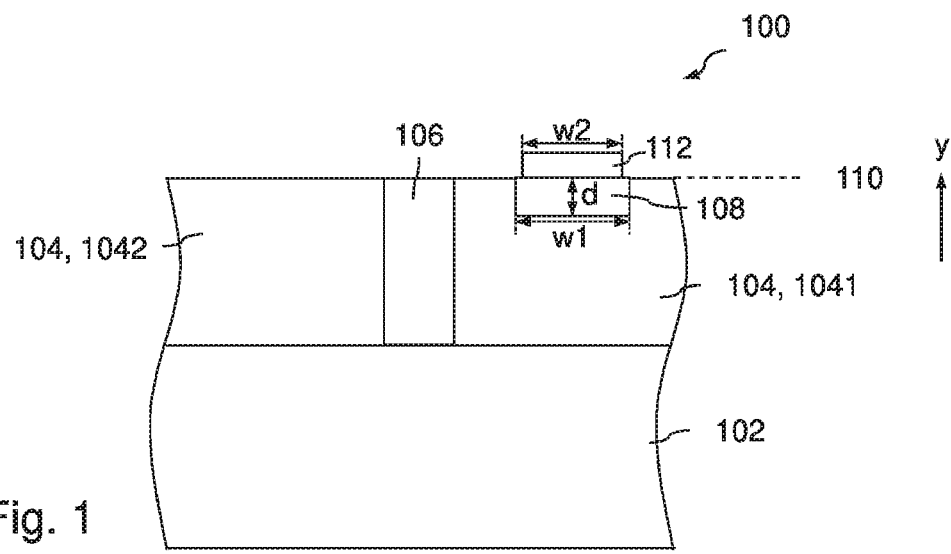
FIG. 1 shows a schematic cross-sectional view of a semiconductor device comprising an electrical resistor on a shallow trench isolation structure in accordance with one exemplary embodiment.

In the following detailed description, reference is made to the accompanying drawings, which form part of the disclosure and show specific exemplary embodiments for illustration purposes. In this context, a direction terminology such as "top side", "bottom", "front side", "rear side", "at the front", "at the back", etc. is related to the orientation of the figures currently being described. Since the components of the exemplary embodiments can be positioned in different orientations, the direction terminology serves only for explanation and should in no way be interpreted as limiting.

It goes without saying that further exemplary embodiments exist, and structural or logical changes can be made to the exemplary embodiments, without departing from what is defined by the patent claims in the process. The description of the exemplary embodiments is non-limiting in this respect. In particular, elements of exemplary embodiments described below can be combined with elements of other exemplary embodiments from among those described, unless something different is evident from the context.

The terms "have", "contain", "encompass", "comprise" and the like hereinafter are open terms which on the one hand indicate the presence of said elements or features, and on the other hand do not exclude the presence of further elements or features. The indefinite articles and the definite articles encompass both the plural and the singular, unless something different is clearly evident from the context.

The term "electrically connected" describes a permanent low-impedance connection between electrically connected elements, for example a direct contact between the relevant elements or a low-impedance connection via a metal and/or a highly doped semiconductor. The term "electrically coupled" includes the fact that one or more intervening elements suitable for signal transmission can be present between the electrically coupled elements, for example elements that are controllable in order to provide at times a low-impedance connection in a first state and a high-impedance electrical decoupling in a second state.

The figures may refer to relative doping concentrations by the indication of "−" or "+" next to the doping type "n" or "p". By way of example, "n−" denotes a doping concentration which is lower than the doping concentration of an "n"-type doping region, while an "n+"-type doping region has a higher doping concentration than an "n"-type doping region. Doping regions of the same relative doping concentration do not necessarily have the same absolute doping concentration. By way of example, two different "n"-type doping regions can have the same or different absolute doping concentrations.

Insulated gate field effect transistors (IGFETs) are voltage-controlled components such as metal oxide semiconductor FETs (MOSFETs), for instance. MOSFETs also include FETs having gate electrodes based on doped semiconductor material and/or gate dielectrics that are not, or not exclusively, based on an oxide.

The term "horizontal" as used in the present description is intended to describe an orientation substantially parallel to a first or main surface of a semiconductor substrate or body. Said surface can be for example the surface of the wafer or of a die or chip.

The term "vertical" as used in the present description is intended to describe an orientation arranged substantially perpendicular to the first surface, i.e. parallel to the direction of the normal to the first surface, of the semiconductor substrate or body.

If a value range with the indication of one limit value or two limit values is defined for a physical variable, then the prepositions "from" and "to" include the respective limit value. An indication of the type "from . . . to" is accordingly understood as "from at least . . . to at most".

The schematic cross-sectional view in FIG. 1 illustrates one exemplary embodiment of a semiconductor device 100. The semiconductor device 100 can be for example a discrete semiconductor component or else an integrated circuit (IC). In this regard, the semiconductor component comprises for example various circuit blocks, which can comprise analog and/or digital blocks and/or power transistors. The semiconductor device 100 can be for example a semiconductor device which is realized using a semiconductor mixed technology. Semiconductor mixed technologies can comprise for example bipolar circuit elements for realizing analog circuit blocks, CMOS (complementary metal oxide semiconductor) circuit elements for realizing digital circuit blocks and power transistors for realizing switches such as low-side switches, high-side switches and bridge configurations. Semiconductor technologies of this type are also known as BCD (Bipolar CMOS DMOS) technology or SPT (Smart Power Technology).

The semiconductor device 100 comprises a semiconductor substrate 102 of a first conductivity type. The first conductivity type can be a p-type or an n-type. The semiconductor substrate 102 can be based on various semiconductor materials, such as, for instance, silicon (Si), silicon-on-insulator (SOI), silicon-on-sapphire (SOS), silicon-germanium, germanium, gallium arsenide, silicon carbide, gallium nitride or else further compound semiconductor materials.

The semiconductor device 100 comprises a semiconductor layer 104 of a second conductivity type on the semiconductor substrate 102, wherein the second conductivity type is different than the first conductivity type. The semiconductor layer 104 can be produced for example by a layer deposition method such as chemical vapor deposition (CVD). The layer deposition can be carried out as epitaxial growth on the semiconductor substrate 102 in order to form the semiconductor layer 104 with the highest possible crystal quality.

The semiconductor device 100 comprises an isolation structure 106, which electrically isolates a first region 1041 of the semiconductor layer 104 from a second region 1042 of the semiconductor layer 104. The first region 1041 and the second region 1042 can be for example regions of the semiconductor layer 104 which adjoin the isolation structure 106 from opposite sides in the lateral direction.

The semiconductor device 100 additionally comprises a shallow trench isolation structure 108, also called STI structure, which extends vertically from a surface 110 of the semiconductor layer 104 into the first region 1041 of the semiconductor layer 104. Examples of insulating materials of the shallow trench isolation structure 108 that may be mentioned are oxides such as $SiO_2$ as thermal oxide, oxides produced by means of vapor deposition (CVD, chemical vapor deposition), e.g. borophosphosilicate glass (BPSG), phosphosilicate glass (PSG), borosilicate glass (BSG), and nitrides, high- and low-k dielectrics or else any desired combination of these materials.

In accordance with one exemplary embodiment, the shallow trench isolation structure 108 comprises an oxide, and a maximum thickness d of the shallow trench isolation structure 108 lies in a range of from 50 nm to 600 nm, or in a range of from 150 nm to 600 nm. The thickness d can be adapted for example to a desired voltage loading capacity of the electrical resistor 112.

The semiconductor device 100 additionally comprises an electrical resistor 112 on the shallow trench isolation structure 108. The electrical resistor 112 can consist of one layer or a layer stack. A resistance value of the electrical resistor 112 can be set for example by means of a suitable sheet resistance (ohms/square, $\Omega/\square$) and geometric dimensioning of the layer or the layers of the layer stack. If the electrical resistor 112 or a layer of the layer stack of the resistor 112 is realized for example as a doped semiconductor layer, e.g. as doped polycrystalline silicon, then a desired sheet resistance can be set for example by varying layer thickness and dopant level or dopant profile in the doped semiconductor layer.

In the exemplary embodiment shown in FIG. 1, the electrical resistor 112 directly adjoins the shallow trench isolation structure 108, and a lateral extent w1 of the shallow trench isolation 108 is greater than a lateral extent w2 of the electrical resistor 112, such that the electrical resistor 112 is formed entirely on the shallow trench isolation 108. This exemplary embodiment enables an advantageous electrical isolation of the electrical resistor from the semiconductor layer and surrounding components.

Figure 2:
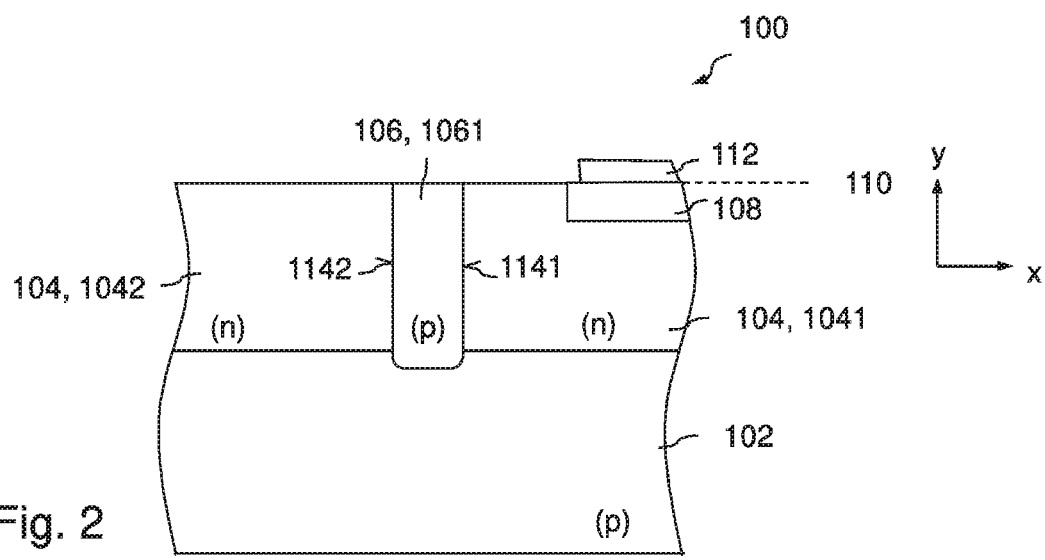
FIG. 2 shows one exemplary embodiment of a semiconductor device comprising a junction isolation structure in a schematic cross-sectional view.

Referring to FIG. 2, one exemplary embodiment of the semiconductor device 100 is illustrated in which the isolation structure 106 is a junction isolation structure 1061 of the first conductivity type, such that a first pn junction 1141 is formed between the junction isolation structure 1061 and the first region 1041 of the semiconductor layer 104, wherein the junction isolation structure 1061 adjoins a side of the first region 1041 of the semiconductor layer 104 and electrically isolates the first region 1041 laterally from the second region 1042 of the semiconductor layer 104. A second pn junction 1142 lies between the junction isolation structure 1061 and the second region 1042 of the semiconductor layer 104. As a result of a suitable choice of the dopant level or dopant profile of the junction isolation structure 1061 relative to the dopant levels or dopant profiles within the first region 1041 and the second region 1042 and also as a result of suitable choice of the lateral extent of the junction isolation structure 1061, it is possible to set a dielectric strength of the lateral electrical isolation of adjacent regions of the semiconductor layer 104, e.g. the first and second regions 1041, 1042 illustrated in FIG. 2. In the schematic cross-sectional view in FIG. 2, the first conductivity type is illustrated for example as the p-type, and the second conductivity type for example as the n-type. It goes without saying that the first conductivity type can also be an n-type, and the second conductivity type a p-type.

The junction isolation structure 1061 extends in the vertical direction y at least as far as the semiconductor substrate 102. In the exemplary embodiment shown in FIG. 2, the junction isolation structure 1061 extends right into the semiconductor substrate 102. In accordance with a further exemplary embodiment, the junction isolation structure 1061 comprises a region which extends in the lateral direction x and which adjoins a bottom of the first region 1041 from below. In this case, the first region 1041 can be completely surrounded by the junction isolation structure 1061 for example as far as the surface 110.

The junction isolation structure 1061 can be produced in diverse ways. By way of example, the junction isolation structure 1061 can be produced by epitaxial filling of a trench and in-situ doping. Alternatively or supplementarily, the junction isolation structure 1061 or parts thereof can be produced by ion implantation of a dopant and activation and vertical outdiffusion of the implanted profile. If the ion implantation is carried out in a plurality of steps at different energies, then a desired depth profile can be realized by virtue of the fact that profiles of the dopant implanted to different depths overlap as a result of thermal treatment and vertical outdiffusion in the vertical direction. Alternatively or supplementarily, the junction isolation structure 1061 or parts thereof can be produced by diffusion of the dopant from a dopant source through the surface 110 into the semiconductor layer 104, e.g. by diffusion from a solid source, such as a glass doped with the dopant, applied on the first surface.

Figure 3:
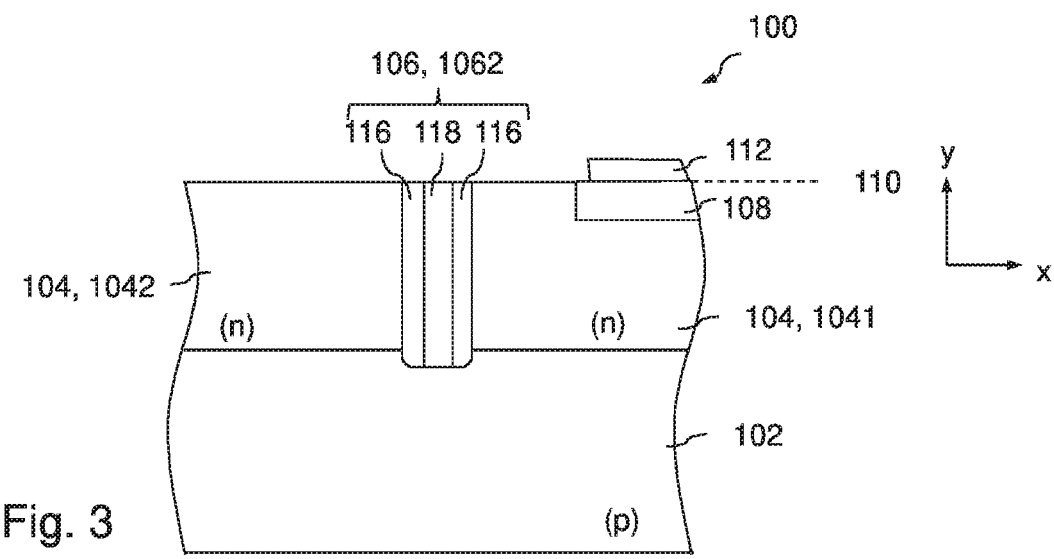
FIG. 3 shows one exemplary embodiment of a semiconductor device comprising a trench isolation structure in a schematic cross-sectional view.

Referring to FIG. 3, one exemplary embodiment of the semiconductor device 100 is illustrated in which the isolation structure 106 is a trench isolation structure 1062, e.g. a DTI (deep trench isolation) structure, which extends from the surface 110 of the semiconductor layer 104 through the semiconductor layer 104 into the semiconductor substrate 102, wherein the trench isolation structure 1062 comprises an isolation layer 116 and a conductive filling 118. The conductive filling 118 and the semiconductor layer 104 are electrically isolated by the isolation layer 116. The conductive filling 118 and the semiconductor substrate 102 are electrically connected at a bottom 120 of the trench isolation structure 1062, and the conductive filling 118 extends from the bottom 120 of the trench isolation structure 1062 as far as the surface 110 of the semiconductor layer 104 in the vertical direction y. Consequently, the trench isolation structure 1062 in the exemplary embodiment shown in FIG. 3 not only serves for the electrical isolation of adjacent regions of the semiconductor layer, e.g. the electrical isolation of the adjacent regions 1041, 1042 in FIG. 3, but additionally enables the semiconductor substrate 102 to be electrically contacted by way of a wiring region above the surface 110 of the semiconductor layer 104. By way of example, conductor tracks and contacts such as contact plugs and/or contact vias for the electrical wiring of the components formed in the semiconductor layer are formed in said wiring region. In the regions of the semiconductor layer 104 that are electrically isolated from one another by the isolation structure in the lateral direction x, e.g. the first and second regions 1041, 1042, for example different semiconductor components are formed, e.g. active or passive components such as transistors, e.g. insulated gate field effect transistors (IG-FETs) such as MOSFETS (metal oxide semiconductor FETs), bipolar transistors (BJT, bipolar junction transistors), diodes, thyristors, resistors, capacitors, inductances.

Figure 4:
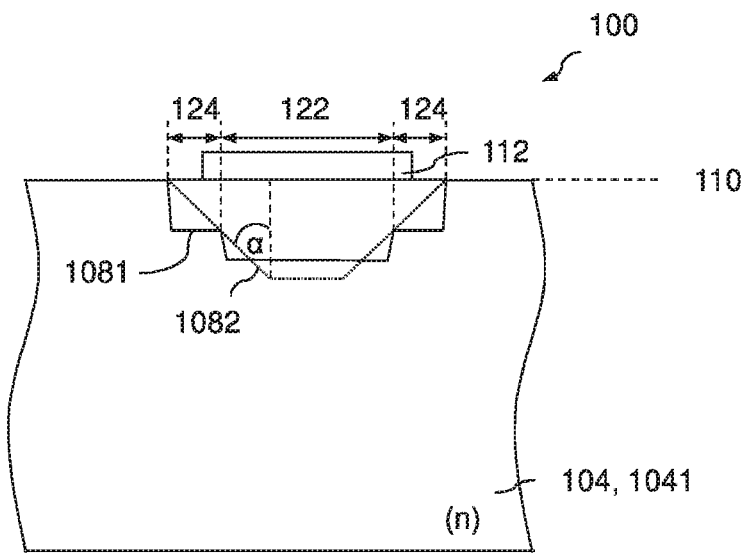
FIG. 4 shows one exemplary embodiment of a semiconductor device comprising differently fashioned shallow trench isolation structures.

Referring to FIG. 4, exemplary embodiments of the semiconductor device 100 are illustrated in which the shallow trench isolation structure 108 comprises an inner region 122 and an outer region 124, wherein the inner region 122 extends into the semiconductor layer 104 more deeply than the outer region 124. In this case, as is illustrated by way of example on the basis of a first shallow trench isolation structure 1081, the inner region 122 can transition to the outer region 124 of the first shallow trench isolation structure 1081 by way of a step. It goes without saying that the first shallow trench isolation structure 1081 can also comprise a plurality of steps, which can also have different heights. Likewise, the inner region 122, as is illustrated by way of example on the basis of a second shallow trench isolation structure 1082, can transition to the outer region 124 of the first shallow trench isolation structure 1081 by way of a beveled sidewall. An angle $\alpha$ of inclination between a normal to the surface 110 and the sidewall can vary in this case, e.g. in a range of from 5° to 60°.

Figure 5:
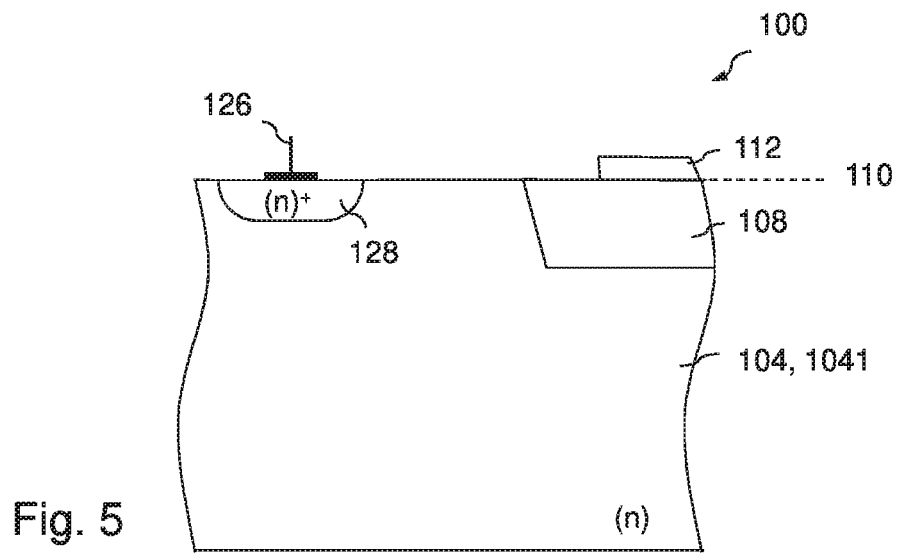
FIG. 5 shows one exemplary embodiment of a semiconductor device comprising an electrical contact structure.

Referring to FIG. 5, one exemplary embodiment of the semiconductor device 100 is illustrated in which the semiconductor device 100 comprises an electrical contact structure 126, which is electrically connected to the first region 1041 of the semiconductor layer 104 at the surface 110 of the semiconductor layer 104. The electrical contact structure 126 is illustrated in a simplified manner in FIG. 5 and can comprise one or a plurality of conductive materials. Examples of conductive materials of the contact structure 126 that may be mentioned are metals, metal silicides, conductive metal-containing compounds such as metal nitrides, alloys, highly doped semiconductors such as highly doped polycrystalline silicon or else any desired combination of these materials. The contact structure 126 can be composed for example of one conductive element or a combination of conductive elements of a wiring region. Conductive elements of a wiring region comprise, inter alia, for example contact plugs, contact vias, conductor tracks or contact pads. A highly doped contact connection zone 128 can be formed for producing a low-impedance electrical contact between the contact structure 126 and the semiconductor layer 104.

Figure 6:
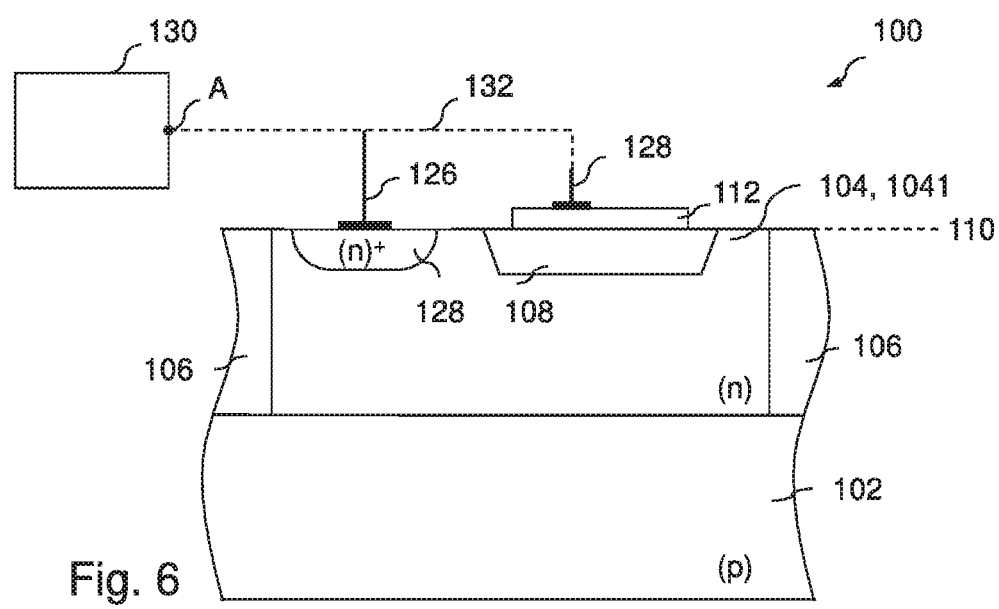
FIG. 6 shows one exemplary embodiment of a semiconductor device in which a region of the semiconductor layer below the electrical resistor is of the n conductivity type throughout, such that no oppositely doped semiconductor zones of the p conductivity type are formed within said region.

Referring to FIG. 6, one exemplary embodiment of the semiconductor device 100 is illustrated in which the first region 1041 of the semiconductor layer 104 is of the second conductivity type throughout, such that no oppositely doped semiconductor zones of the first conductivity type are formed within the first region 1041. Consequently, the first region 1041 is assigned exclusively to the resistor 112 and serves for setting the voltage loading capacity of the resistor 112.

In the exemplary embodiment shown in FIG. 6, the contact structure 126 can be electrically connected to an intermediate tap 128 of the electrical resistor 112. The electrical connection is illustrated by way of example by means of a dashed line 132. This enables the dielectric strength of the electrical resistor 112 to be increased by virtue of the fact that, during the operation of the semiconductor device 100, a potential of the semiconductor layer 104 in the first region 1041 can be put at an intermediate potential of the electrical resistor 112. By way of example, if 0V and 100V are present at the two terminals of the electrical resistor and the intermediate potential is 50V, then the maximum voltage drop across the shallow trench isolation structure is 50V, rather than for instance 100V as would be the case if the first region 1041 were at a potential of 0V. The contact structure 126 can alternatively also be electrically connected to an output A of a reference voltage circuit 130. The electrical connection is illustrated by way of example by means of a dashed line 134. The reference voltage circuit 130 can be realized in diverse ways and be coordinated with the requirements in the application with regard to the circuitry outlay. By way of example, the reference voltage circuit 130 can be configured to provide an intermediate potential even in the case of fast voltage pulses.

Figure 7A:
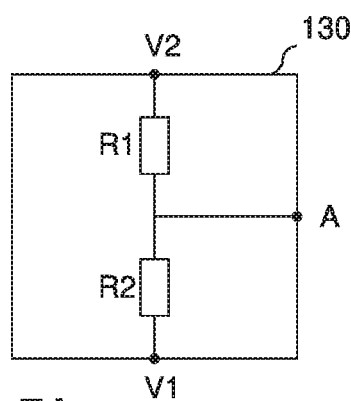
FIGS. 7A and 7B show exemplary embodiments of reference voltage circuits for generating an intermediate potential for the region of the semiconductor layer below the electrical resistor.
Figure 7B:
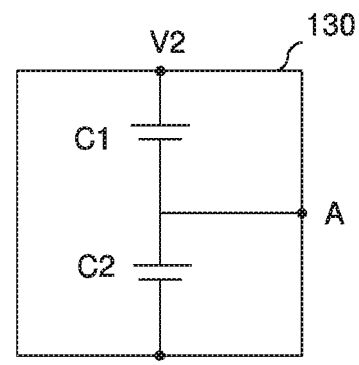

In accordance with the exemplary embodiments shown in FIGS. 7A and 7B, the reference voltage circuit 130 comprises a resistive voltage divider (cf. FIG. 7A) or a capacitive voltage divider (cf. FIG. 7B). Resistance values of resistors R1 and R2 of the resistive voltage divider and also the capacitances of the capacitors C1, C2 of the capacitive voltage divider can be set relative to one another such that a desired intermediate potential for the first region 1041 is available at the output A during operation. Supply terminals V1, V2 of the reference voltage circuit 130 can be connected to ground, GND, and a supply voltage VS for example during the operation of the semiconductor device 100.

Figure 8:
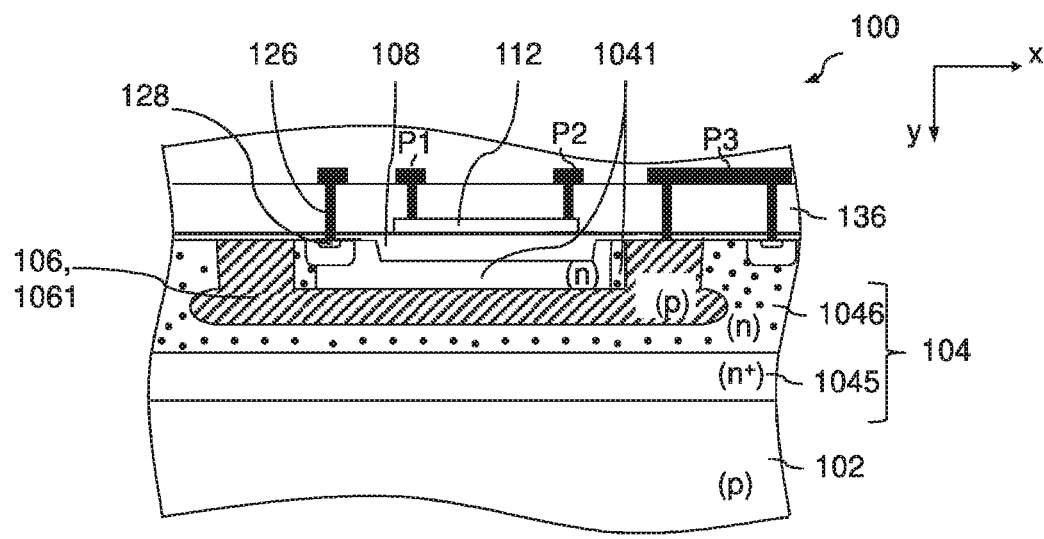
FIG. 8 shows one exemplary embodiment of a semiconductor device comprising a junction isolation structure, which adjoins from below the region of the semiconductor layer beneath the electrical resistor.

Referring to FIG. 8, one exemplary embodiment of the semiconductor device 100 is illustrated in which the semiconductor layer 104 comprises a first partial layer 1045 and a second partial layer 1046. The first partial layer 1045 is formed between the second partial layer 1046 and the semiconductor substrate 102 and is more highly doped than the second partial layer 1046. In this case, a dopant level and a dopant profile of the first partial layer 1045 can be set for example with regard to a desired reverse voltage class of the electrical breakdown with respect to the semiconductor substrate 102 and a desired suppression of a parasitic bipolar transistor with respect to the semiconductor substrate 102 with the semiconductor layer 104 as a basis. A dopant level and a dopant profile of the second partial layer 1046 can be set for example with regard to the components to be realized in this layer. The subdivision of the semiconductor layer 104 into the first partial layer 1045 and the second partial layer 1046 can be applied to all of the exemplary embodiments described in this application.

By way of example, a vertical dopant profile of the semiconductor layer 104 and a vertical dopant profile of the semiconductor substrate 102 are configured in such a way that a breakdown voltage between the semiconductor substrate 102 and the semiconductor layer 104 lies in a range of from 20V to 250V, or in a range of from 90V to 150V.

The junction isolation structure 1061 shown in the exemplary embodiment in FIG. 8 comprises a region which extends in the lateral direction x and which adjoins a bottom of the first region 1041 of the semiconductor layer 104 from below and thus enables an extensive electrical isolation.

The electrical resistor 112 is formed on the shallow trench isolation structure 108 and electrically contacted by the contact structures P1 and P2. A contact structure P3 serves for electrically connecting the shallow trench isolation structure 108 to a surrounding part of the semiconductor layer 104.

The contact structures 126, P1, P2, P3 extend through an interlayer dielectric 136.

Figure 9:
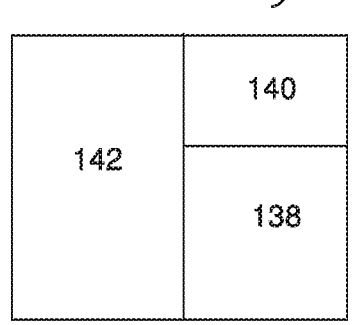
FIG. 9 shows one exemplary embodiment of an integrated circuit.

Referring to FIG. 9, one exemplary embodiment of an integrated circuit 101 is illustrated in a simplified manner. The integrated circuit 101 comprises an analog circuit part 138, a digital circuit part 140, a power circuit part 142, wherein the electrical resistor 112 of the semiconductor device 100 according to any of the preceding exemplary embodiments can be formed in one of the circuit parts 138, 140, 142. The integrated circuit 101 is, for example, a single- or multi-channel switch, a motor bridge, a motor driver circuit, a DC/DC voltage converter, a CAN or LIN transceiver, or a voltage regulator.

Although specific embodiments have been illustrated and described herein, those skilled in the art will recognize that the specific embodiments shown and described can be replaced by a multiplicity of alternative and/or equivalent configurations, without departing from the scope of protection of the invention. The application is intended to cover any adaptations or variations of the specific embodiments discussed herein. Therefore, the invention is restricted only by the claims and the equivalents thereof.

What is claimed is:

1. A semiconductor device, comprising:
a semiconductor substrate of a first conductivity type;
a semiconductor layer of a second conductivity type on the semiconductor substrate, the second conductivity type being different than the first conductivity type;
an isolation structure electrically isolating a first region of the semiconductor layer from a second region of the semiconductor layer;
a shallow trench isolation structure vertically extending from a surface of the semiconductor layer into the first region of the semiconductor layer;
an electrical resistor on the shallow trench isolation structure; and
an electrical contact structure electrically connected to the first region of the semiconductor layer at the surface of the semiconductor layer, and electrically connected to an intermediate tap of the electrical resistor or to a reference voltage circuit for providing an intermediate potential.

2. The semiconductor device of claim 1, wherein the isolation structure is a junction isolation structure of the first conductivity type, such that a pn junction is formed between the junction isolation structure and the first region of the semiconductor layer, and wherein the junction isolation structure adjoins a side of the first region of the semiconductor layer and electrically isolates the first region laterally from the second region of the semiconductor layer.

3. The semiconductor device of claim 1, wherein the isolation structure is a trench isolation structure which extends from the surface of the semiconductor layer through the semiconductor layer and into the semiconductor substrate, and wherein the trench isolation structure comprises an isolation layer and a conductive filling, wherein the isolation layer electrically isolates the conductive filling and the semiconductor layer, wherein the conductive filling and the semiconductor substrate are electrically connected at a bottom of the trench isolation structure, and wherein the conductive filling extends from the bottom of the trench isolation structure as far as the surface of the semiconductor layer in a vertical direction.

4. The semiconductor device of claim 1, wherein the electrical resistor directly adjoins the shallow trench isolation structure, and wherein a lateral extent of the shallow trench isolation is greater than a lateral extent of the electrical resistor, such that the electrical resistor is formed entirely on the shallow trench isolation structure.

5. The semiconductor device of claim 1, wherein the shallow trench isolation structure comprises an inner region and an outer region, wherein the inner region extends into the semiconductor layer more deeply than the outer region.

6. The semiconductor device of claim 1, wherein the first region of the semiconductor layer is of the second conductivity type throughout, such that no oppositely doped semiconductor zones of the first conductivity type are formed within the first region.

7. The semiconductor device of claim 1, wherein the reference voltage circuit comprises a resistive or a capacitive voltage divider.

8. The semiconductor device of claim 1, wherein the shallow trench isolation structure comprises an oxide, and wherein a maximum thickness of the shallow trench isolation structure is in a range of 50 nm to 600 nm.

9. The semiconductor device of claim 1, wherein the semiconductor layer comprises a first partial layer and a second partial layer, and the first partial layer is formed between the second partial layer and the semiconductor substrate and is more highly doped than the second partial layer.

10. The semiconductor device of claim 1, wherein a vertical dopant profile of the semiconductor layer and a vertical dopant profile of the semiconductor substrate are configured in such a way that a breakdown voltage between the semiconductor substrate and the semiconductor layer is in a range of 20V to 250V.

11. An integrated circuit comprising an analog circuit part, a digital circuit part, a power circuit part and the semiconductor device of claim 1.

12. The integrated circuit of claim 11, wherein the integrated circuit is a single- or multi-channel switch, a motor bridge, a motor driver circuit, a DC/DC voltage converter, a CAN or LIN transceiver, or a voltage regulator.

13. A semiconductor device, comprising:
a semiconductor substrate of a first conductivity type;
a semiconductor layer of a second conductivity type on the semiconductor substrate, the second conductivity type being different than the first conductivity type;
an isolation structure electrically isolating a first region of the semiconductor layer from a second region of the semiconductor layer;
a shallow trench isolation structure vertically extending from a surface of the semiconductor layer into the first region of the semiconductor layer; and
an electrical resistor on the shallow trench isolation structure,
wherein the isolation structure is a trench isolation structure which extends from the surface of the semiconductor layer through the semiconductor layer and into the semiconductor substrate, the trench isolation structure comprising an isolation layer and a conductive filling,
wherein the isolation layer electrically isolates the conductive filling and the semiconductor layer,
wherein the conductive filling and the semiconductor substrate are electrically connected at a bottom of the trench isolation structure,
wherein the conductive filling extends from the bottom of the trench isolation structure as far as the surface of the semiconductor layer in a vertical direction.

14. An integrated circuit comprising an analog circuit part, a digital circuit part, a power circuit part and the semiconductor device of claim 13.

15. The integrated circuit of claim 14, wherein the integrated circuit is a single- or multi-channel switch, a motor bridge, a motor driver circuit, a DC/DC voltage converter, a CAN or LIN transceiver, or a voltage regulator.

* * * * *